(12) United States Patent
Yaegashi

(10) Patent No.: US 7,842,993 B2
(45) Date of Patent: Nov. 30, 2010

(54) NONVOLATILE SEMICONDUCTOR MEMORY DEVICE SUPPRESSING FLUCTUATION IN THRESHOLD VOLTAGE

(75) Inventor: Toshitake Yaegashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/538,469

(22) Filed: Aug. 10, 2009

(65) Prior Publication Data

US 2010/0038704 A1 Feb. 18, 2010

(30) Foreign Application Priority Data

Aug. 12, 2008 (JP) .............................. 2008-207963

(51) Int. Cl.
*H01L 29/788* (2006.01)
(52) U.S. Cl. .................................... 257/315
(58) Field of Classification Search ......... 257/315–321, 257/326, E29.309
See application file for complete search history.

(56) References Cited

U.S. PATENT DOCUMENTS

| | | | |
|---|---|---|---|
| 6,545,311 B2 * | 4/2003 | Shukuri et al. | 257/314 |
| 7,635,890 B2 | 12/2009 | Ozawa et al. | |
| 7,663,912 B2 * | 2/2010 | Jeon | 365/185.01 |
| 7,682,899 B2 | 3/2010 | Natori et al. | |
| 2004/0141377 A1 * | 7/2004 | Arai et al. | 365/185.22 |
| 2005/0012142 A1 * | 1/2005 | Hazama et al. | 257/326 |
| 2007/0241390 A1 * | 10/2007 | Tanaka et al. | 257/314 |
| 2008/0067576 A1 | 3/2008 | Yaegashi | |
| 2009/0121275 A1 * | 5/2009 | Kim et al. | 257/321 |
| 2009/0159953 A1 * | 6/2009 | Kim | 257/316 |
| 2009/0173989 A1 | 7/2009 | Yaegashi | |
| 2010/0038704 A1 | 2/2010 | Yaegashi | |

OTHER PUBLICATIONS

Jae Sung Sim, et al., "Self Aligned Trap-Shallow Trench Isolation Scheme for the Reliability of TANOS (TaN/AlO/SiN/Oxide/Si) NAND Flash Memory", NVSMW, Aug. 2007, pp. 110-111.
U.S. Appl. No. 11/854,845, filed Sep. 13, 2007, Yaegashi.
U.S. Appl. No. 12/331,869, filed Dec. 10, 2008, Yaegashi.
U.S. Appl. No. 12/538,469, filed Aug. 10, 2009, Yaegashi.

* cited by examiner

*Primary Examiner*—Nathan W Ha
(74) *Attorney, Agent, or Firm*—Oblon, Spivak, McClelland, Maier & Neustadt, L.L.P.

(57) ABSTRACT

First and second memory cell transistors are isolated by an element isolation insulating film. A barrier insulating film covers the element isolation insulating film. The first memory cell transistor includes a first tunnel insulating film, a first charge storage layer made of an insulating film, a first block insulating film, and a first gate electrode. The second memory cell transistor includes a second tunnel insulating film, a second charge storage layer made of an insulating film, a second block insulating film, and a second gate electrode. The barrier insulating film is in contact with the first and second charge storage layers, and has a film thickness smaller than that of the first and second charge storage layers.

20 Claims, 16 Drawing Sheets

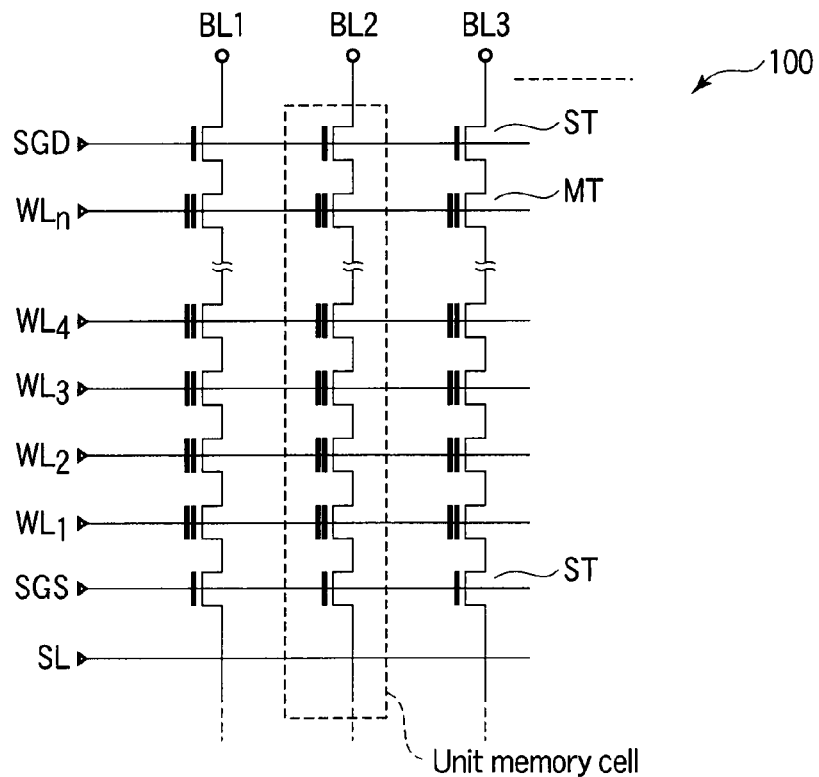
F I G. 1A
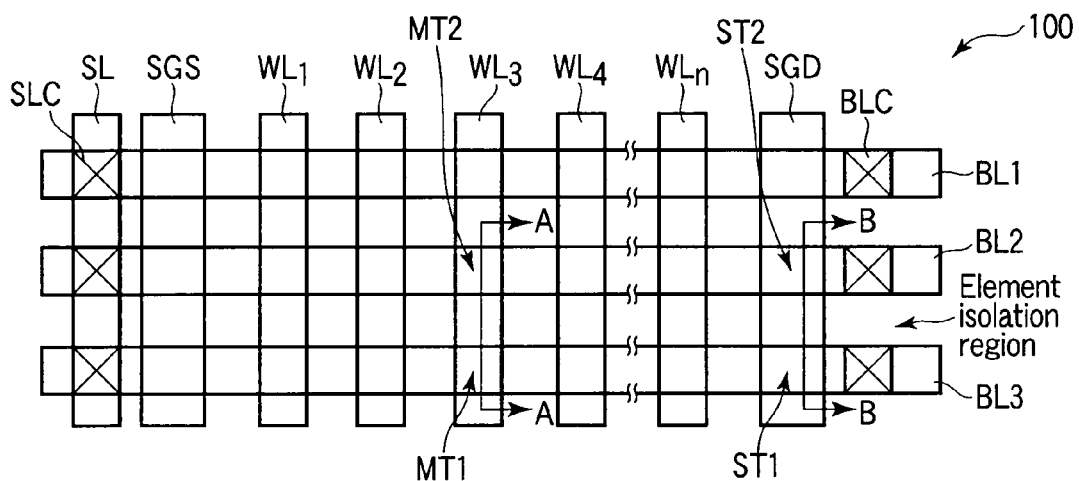
F I G. 1B

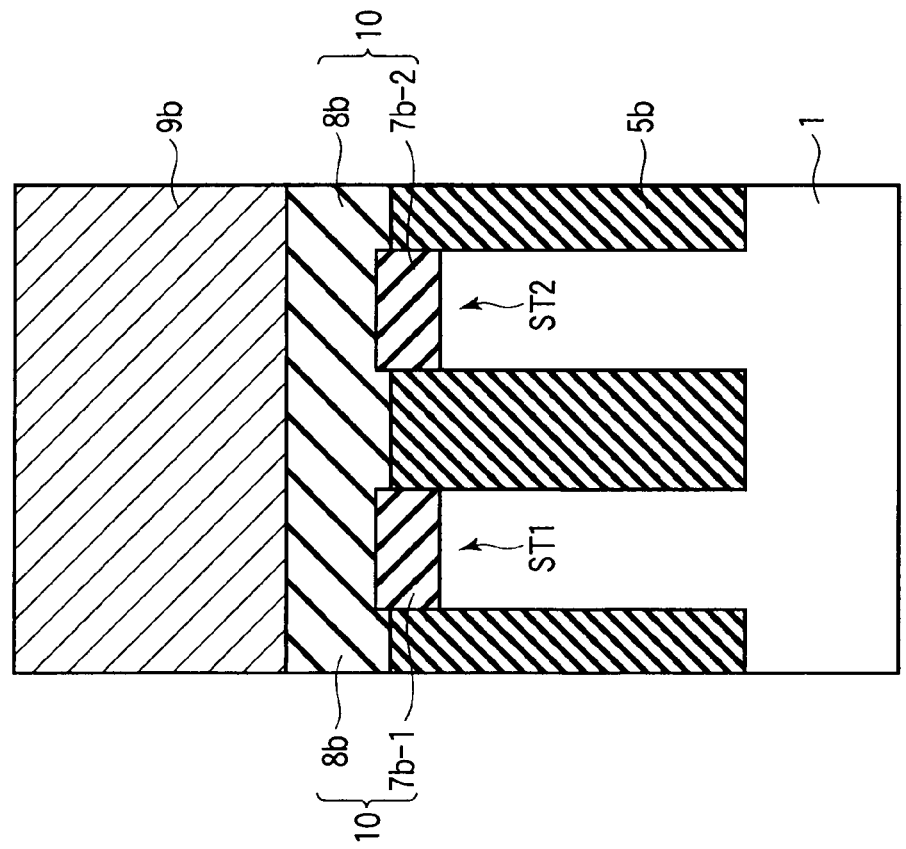
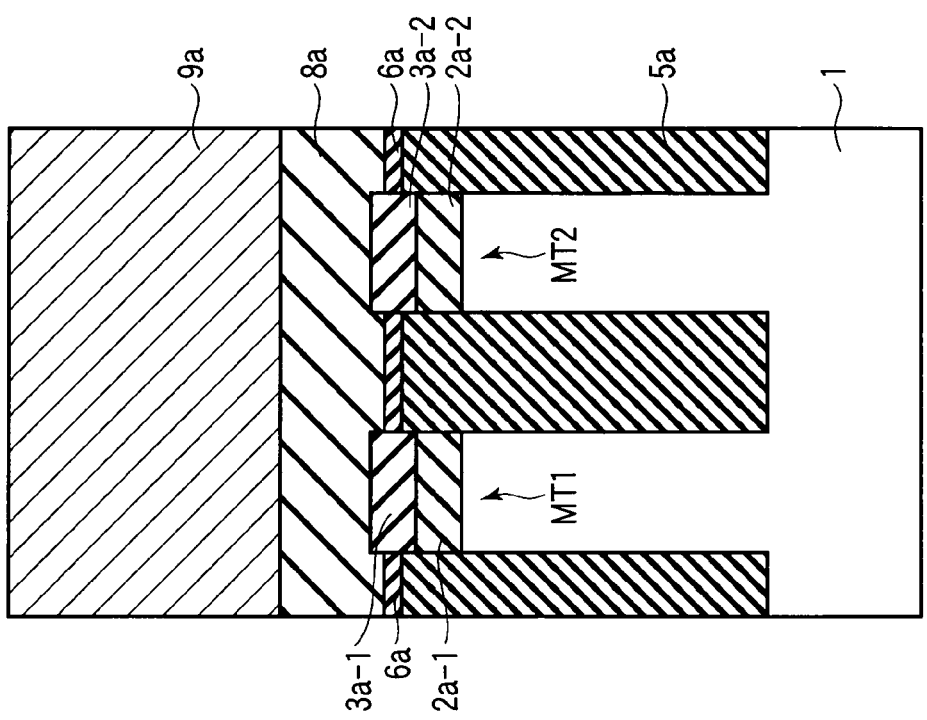
FIG. 2A
FIG. 2B

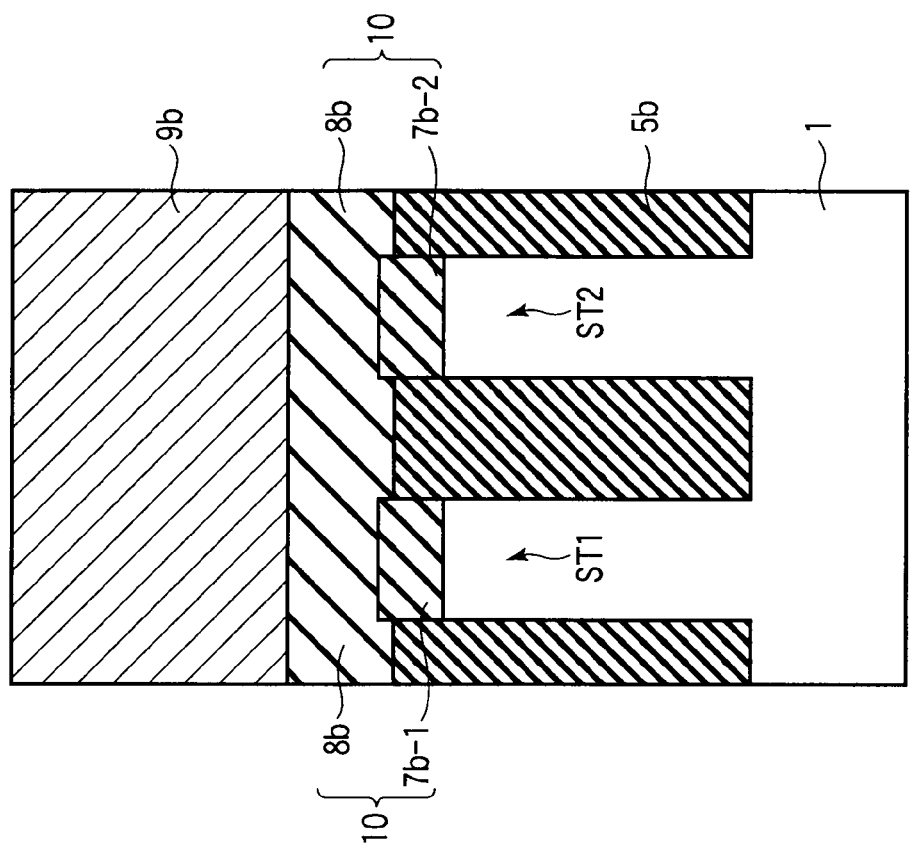
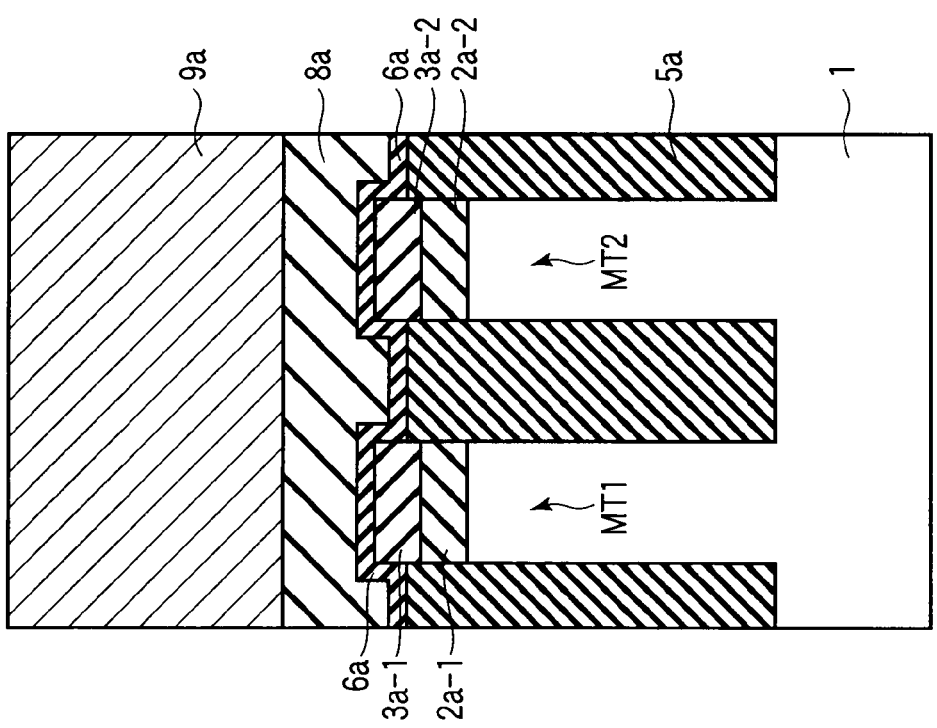

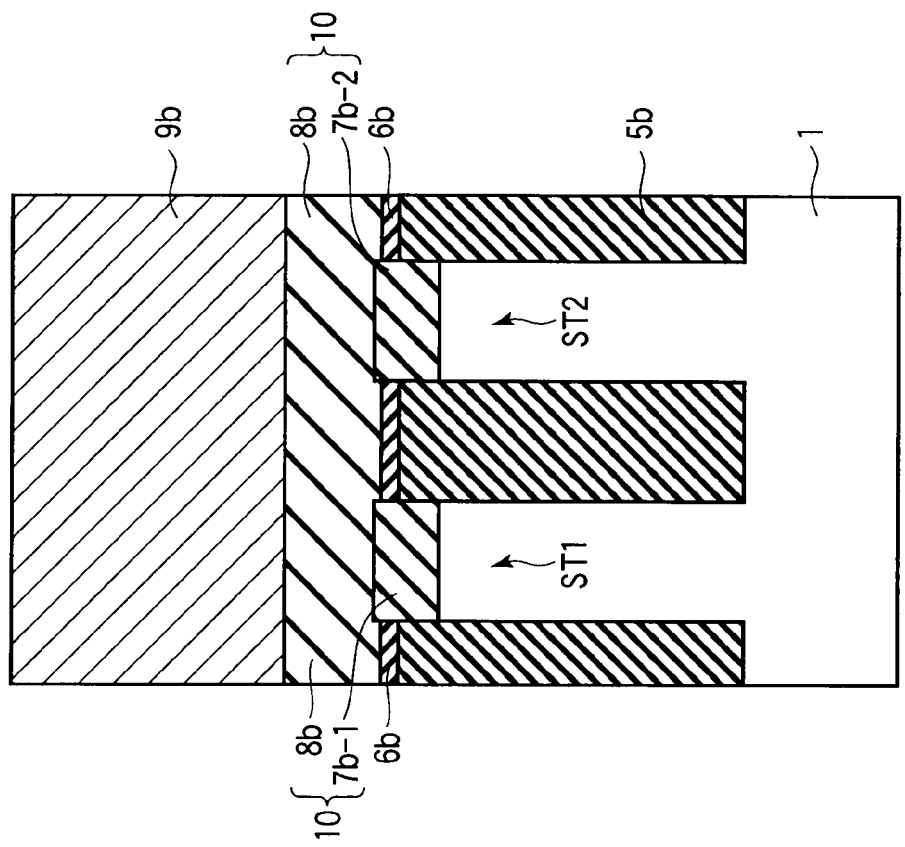
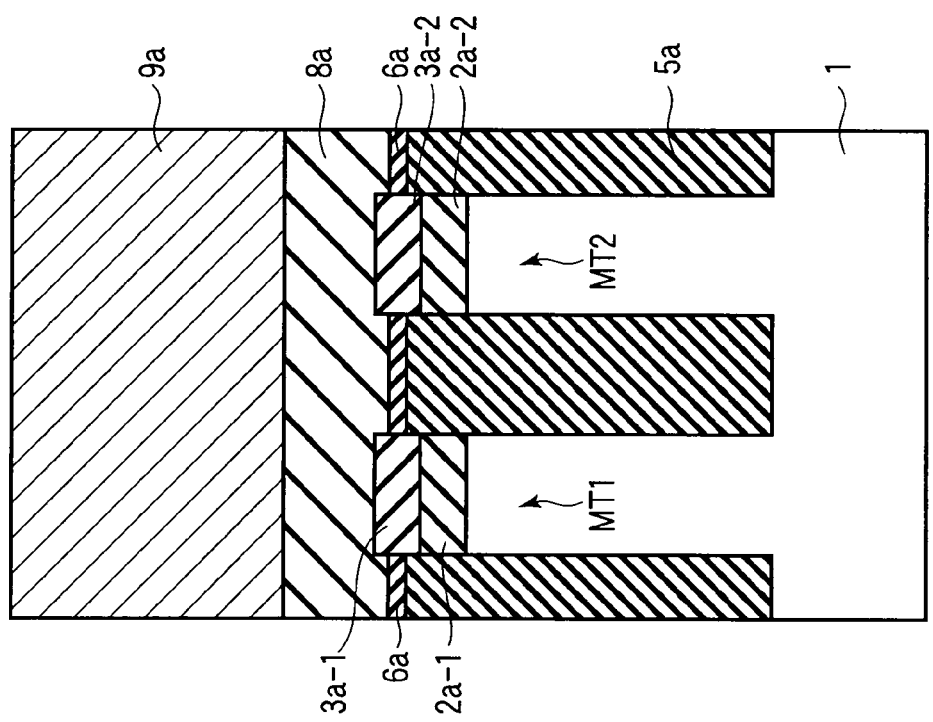

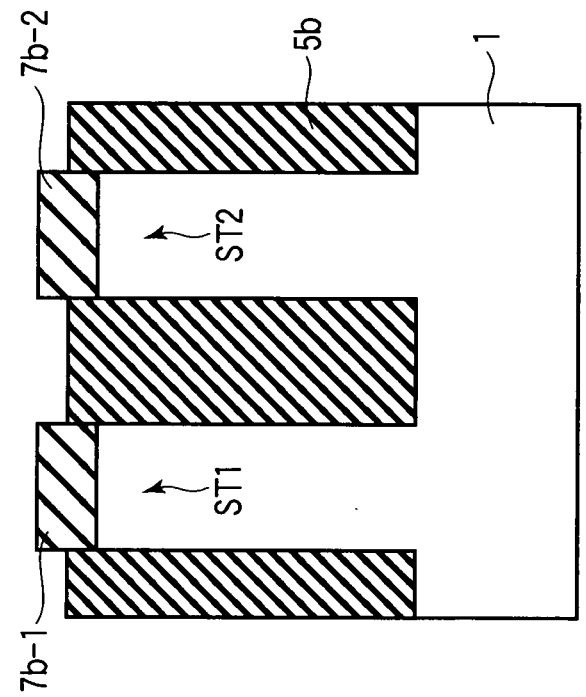
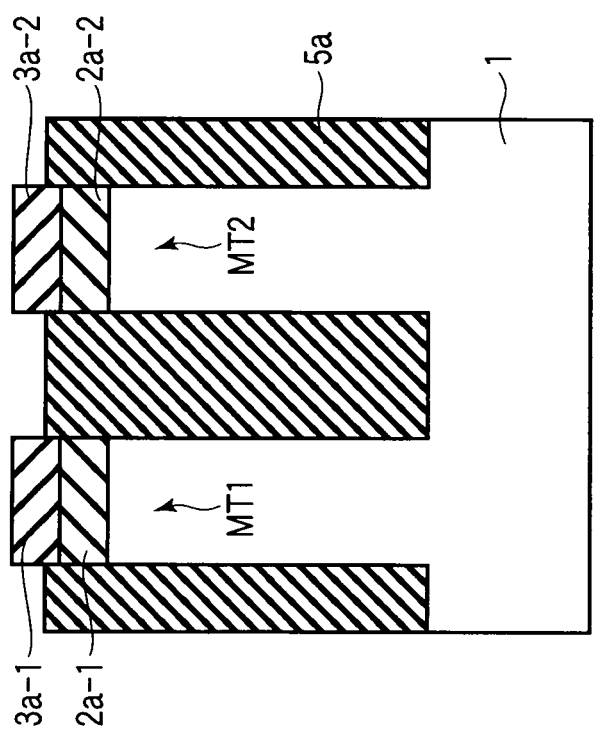

NONVOLATILE SEMICONDUCTOR MEMORY DEVICE SUPPRESSING FLUCTUATION IN THRESHOLD VOLTAGE

CROSS-REFERENCE TO RELATED APPLICATIONS

This application is based upon and claims the benefit of priority from prior Japanese Patent Application No. 2008-207963, filed Aug. 12, 2008, the entire contents of which are incorporated herein by reference.

BACKGROUND OF THE INVENTION

1. Field of the Invention

The present invention relates to a nonvolatile semiconductor memory device including a memory cell transistor having a barrier insulating film.

2. Description of the Related Art

In a nonvolatile semiconductor memory device using a MONOS cell as a memory cell transistor, a tunnel insulating film, charge storage layer, block insulating film, and gate electrode are stacked on en element region isolated by an element isolation region. To obtain a structure in which no charge storage layer is formed between memory cell transistors in order to prevent the movement of electric charge between adjacent cells, the block insulating film is stacked on the element isolation region (see, e.g., Jae Sung Sim, "Self Aligned Trap-Shallow Trench Isolation Scheme For the Reliability of TANOS (TaN/AlO/SiN/Oxide/Si) NAND Flash Memory", NVSMW August, 2007, Pages 110-111).

To improve the write/erase characteristics of the memory cell transistor, it is effective to use, as the block insulating film, an insulating film (high-k film) having a dielectric constant larger than that of the tunnel insulating film.

When the high-k film is used as the block insulating film, however, an impurity element produced when the high-k film is formed generates a fixed electric charge near the element region. This fluctuates the threshold voltage of the memory cell transistor, and deteriorates the characteristics of the memory cell transistor.

BRIEF SUMMARY OF THE INVENTION

According to a first aspect of the invention, there is provided a nonvolatile semiconductor memory device comprising: a semiconductor substrate; a first element isolation insulating film formed in the semiconductor substrate; a first memory cell transistor and a second memory cell transistor isolated by the first element isolation insulating film; and a first barrier insulating film covering the first element isolation insulating film, the first memory cell transistor including a first tunnel insulating film formed on the semiconductor substrate, a first charge storage layer formed on the first tunnel insulating film and made of an insulating film, a first block insulating film formed on the first charge storage layer, and a first gate electrode formed on the first block insulating film, the second memory cell transistor including a second tunnel insulating film formed on the semiconductor substrate, a second charge storage layer formed on the second tunnel insulating film and made of an insulating film, a second block insulating film formed on the second charge storage layer, and a second gate electrode formed on the second block insulating film, and the first barrier insulating film being in contact with the first charge storage layer and the second charge storage layer, and having a film thickness smaller than that of the first charge storage layer and the second charge storage layer.

According to a second aspect of the invention, there is provided A nonvolatile semiconductor memory device comprising: a semiconductor substrate; a first element isolation insulating film formed in the semiconductor substrate; a first memory cell transistor and a second memory cell transistor isolated by the first element isolation insulating film; and a first barrier insulating film covering the first element isolation insulating film, the first memory cell transistor including a first tunnel insulating film formed on the semiconductor substrate, a first charge storage layer formed on the first tunnel insulating film and made of an insulating film, a first block insulating film formed on the first charge storage layer, and a first gate electrode formed on the first block insulating film, the second memory cell transistor including a second tunnel insulating film formed on the semiconductor substrate, a second charge storage layer formed on the second tunnel insulating film and made of an insulating film, a second block insulating film formed on the second charge storage layer, and a second gate electrode formed on the second block insulating film, and the first barrier insulating film being in contact with the first charge storage layer and the second charge storage layer, and made of an insulating film different from the first charge storage layer and the second charge storage layer

BRIEF DESCRIPTION OF THE SEVERAL VIEWS OF THE DRAWING

FIG. 1A is a circuit diagram showing a NAND flash memory related to each embodiment of the present invention;

FIG. 1B is a plan view showing the NAND flash memory related to each embodiment of the present invention;

FIG. 2A is a sectional view taken along a line A-A in FIG. 1B, showing memory cell transistors of a nonvolatile semiconductor memory device according to the first embodiment of the present invention;

FIG. 2B is a sectional view taken along a line B-B in FIG. 1B, showing selection transistors of the nonvolatile semiconductor memory device according to the first embodiment of the present invention;

FIGS. 3A to 8A are sectional views taken along the line A-A in FIG. 1B, showing a method of fabricating the memory cell transistors of the nonvolatile semiconductor memory device according to the first embodiment of the present invention;

FIGS. 3B to 8B are sectional views taken along the line B-B in FIG. 1B, showing a method of fabricating the selection transistors of the nonvolatile semiconductor memory device according to the first embodiment of the present invention;

FIG. 9A is a sectional view taken along the line A-A in FIG. 1B, showing memory cell transistors of a nonvolatile semiconductor memory device according to the second embodiment of the present invention;

FIG. 9B is a sectional view taken along the line B-B in FIG. 1B, showing selection transistors of the nonvolatile semiconductor memory device according to the second embodiment of the present invention;

FIGS. 10A to 12A are sectional views taken along the line A-A in FIG. 1B, showing a method of fabricating the memory cell transistors of the nonvolatile semiconductor memory device according to the second embodiment of the present invention;

FIGS. 10B to 12B are sectional views taken along the line B-B in FIG. 1B, showing a method of fabricating the selection transistors of the nonvolatile semiconductor memory device according to the second embodiment of the present invention;

FIG. 13A is a sectional view taken along the line A-A in FIG. 1B, showing memory cell transistors of a nonvolatile semiconductor memory device according to the third embodiment of the present invention;

FIG. 13B is a sectional view taken along the line B-B in FIG. 1B, showing selection transistors of the nonvolatile semiconductor memory device according to the third embodiment of the present invention;

FIGS. 14A to 16A are sectional views taken along the line A-A in FIG. 1B, showing a method of fabricating the memory cell transistors of the nonvolatile semiconductor memory device according to the third embodiment of the present invention; and FIGS. 14B to 16B are sectional views taken along the line B-B in FIG. 1B, showing a method of fabricating the selection transistors of the nonvolatile semiconductor memory device according to the third embodiment of the present invention.

DETAILED DESCRIPTION OF THE INVENTION

Figure 3B:
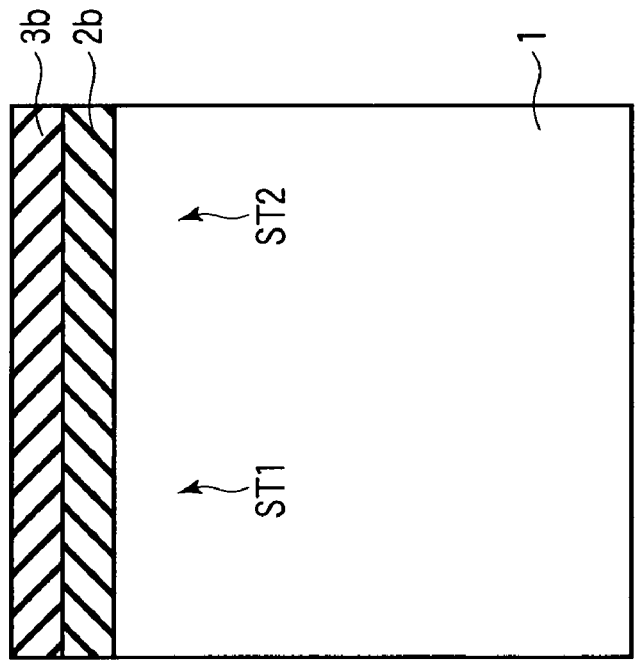

Embodiments of the present invention will be explained below with reference to the accompanying drawing. In the following explanation, the same reference numerals denote the same parts throughout the drawings. Note that a nonvolatile semiconductor memory device of each embodiment is, e.g., a NAND or NOR flash memory, particularly, a flash memory having a MONOS structure.

The structure of the NAND flash memory will be explained below with reference to FIGS. 1A and 1B. FIG. 1A is a circuit diagram of a semiconductor memory device. FIG. 1B is a plan view of the semiconductor memory device.

As shown in FIG. 1A, a semiconductor memory device 100 has a plurality of unit memory cells. A plurality of unit memory cells form a memory cell block, and a plurality of memory cell blocks form a memory cell array. The semiconductor memory device 100 is a NAND flash memory.

The unit memory cell has selection transistors ST on the side of a bit line BL connected to a sense amplifier (not shown), and on the side of a source line SL. A plurality of memory cell transistors MT are connected in series between the selection transistors ST formed on the sides of the bit line BL and source line SL. Bit lines BL1, BL2, and BL3 intersect a control line SGD, word lines WLn, . . . , WL4, WL3, WL2, and WL1, a control line SGS, and the source line SL.

The control line SGD is connected to the gates of the selection transistors ST on the sides of the bit lines BL1 to BL3 connected to the sense amplifier (not shown). The word line WLn is connected to the control gates of nth memory cell transistors MT connected to the bit lines BL1 to BL3. The word line WL4 is connected to the control gates of fourth memory cell transistors MT connected to the bit lines BL1 to BL3. The word line WL3 is connected to the control gates of third memory cell transistors MT connected to the bit lines BL1 to BL3. The word line WL2 is connected to the control gates of second memory cell transistors MT connected to the bit lines BL1 to BL3. The word line WL1 is connected to the control gates of first memory cell transistors MT connected to the bit lines BL1 to BL3. The control line SGS is connected to the gates of the selection transistors ST on the sides of the bit lines BL1 to BL3 connected to the source line SL.

In the semiconductor memory device 100 as shown in FIG. 1B, the source line SL, control line SGS, word lines WL1, WL2, WL3, WL4, . . . , WLn, and control line SGD run parallel in the vertical direction (of FIG. 1B) as they are spaced apart from each other. The bit lines BL1 to BL3 run parallel in the horizontal direction (of FIG. 1B) as they are spaced apart from each other. Element isolation regions are formed between the bit lines BL, and isolate the bit lines BL. Source line contacts SLC are formed at the intersections of the source line SL and bit lines BL1 to BL3. Bit line contacts BLC are formed on the bit lines BL between the control line SGD and sense amplifier (not shown).

Note that FIGS. 2A to 16A are sectional views taken along a line A-A in FIG. 1B, and FIGS. 2B to 16B are sectional views taken along a line B-B in FIG. 1B.

First Embodiment

The first embodiment is an example in which a barrier insulating film covering an element isolation insulating film is formed in a memory cell transistor.

FIG. 2A is a sectional view in the channel width direction of memory cell transistors of a nonvolatile semiconductor memory device according to the first embodiment of the present invention. FIG. 2B is a sectional view in the channel width direction of selection transistors of the nonvolatile semiconductor memory device according to the first embodiment of the present invention. The structures of the memory cell transistor and selection transistor of the nonvolatile semiconductor memory device according to the first embodiment will be explained below.

In the section in the channel width direction of memory cell transistors MT1 and MT2 as shown in FIG. 2A, element isolation insulating films 5a are formed in a semiconductor substrate 1, and the memory cell transistors MT1 and MT2 isolated by the element isolation insulating films 5a are formed. Between the memory cell transistors MT1 and MT2, barrier insulating films 6a are formed to cover the element isolation insulating films 5a.

In the memory cell transistors MT1 and MT2, tunnel insulating films 2a-1 and 2a-2 are formed on the semiconductor substrate 1. Charge storage layers 3a-1 and 3a-2 made of insulating films are formed on the tunnel insulating films 2a-1 and 2a-2. A block insulating film 8a is formed on the charge storage layers 3a-1 and 3a-2 and barrier insulating films 6a. A gate electrode (control gate) 9a to which a control voltage is applied for write, erase, and read of the memory cell transistors MT1 and MT2 is formed on the block insulating film 8a.

The block insulating film 8a is a film (e.g., an $Al_2O_3$ film) having a dielectric constant larger than that of the tunnel insulating films 2a-1 and 2a-2 (e.g., silicon oxide films). This makes it possible to improve the write/erase characteristics of the memory cell transistors MT1 and MT2.

The barrier insulating films 6a are formed between the element isolation insulating films 5a and block insulating film 8a. The side surfaces of the barrier insulating films 6a are in contact with the adjacent charge storage layers 3a-1 and 3a-2. Therefore, the element isolation insulating films 5a are completely covered with the barrier insulating films 6a. Accordingly, the upper surfaces of the element isolation insulating films 5a are not in direct contact with the block insulating film 8a.

The barrier insulating films 6a are formed by a layer different from the charge storage layers 3a-1 and 3a-2. That is, the barrier insulating films 6a are not formed by the same layer as the charge storage layers 3a-1 and 3a-2.

Even when the barrier insulating films 6a and charge storage layers 3a-1 and 3a-2 are made of the same material (e.g., a silicon nitride film), the material need only have different compositions (properties). Likewise, even when the barrier insulating films 6a and charge storage layers 3a-1 and 3a-2 are made of the same material (e.g., a silicon nitride film) having the same properties, the film thickness of the barrier insulating films 6a need only be smaller than that of the charge storage layers 3a-1 and 3a-2.

Examples of the material of the barrier insulating film 6a are a silicon nitride film and silicon oxynitride film. The barrier insulating film 6a may also be a film that changes from a silicon nitride film to a silicon oxynitride film from the upper surface toward the bottom surface. The barrier insulating films 6a are desirably formed in a nitriding atmospherics.

The film thickness of the barrier insulating films 6a is desirably smaller than that of the charge storage layers 3a-1 and 3a-2. This makes it possible to suppress the movement of electric charge between the adjacent memory cell transistors MT1 and MT2, and improve deterioration of the data holding characteristic.

The upper surfaces of the element isolation insulating films 5a and barrier insulating films 6a are desirably lower than those of the charge storage layers 3a-1 and 3a-2. This is so because when the block insulating film 8a covers the side surfaces of the charge storage layers 3a-1 and 3a-2, the electrical characteristics of charge storage layers 3a-1 and 3a-2 controlled by the gate electrode 9a improves, and the memory cell characteristics improve.

The upper surfaces of the element isolation insulating films 5a are desirably higher than those of the tunnel insulating films 2a-1 and 2a-2. This is so because when the element isolation insulating films 5a and tunnel insulating films 2a-1 and 2a-2 are made of the same material, or when the tunnel insulating films 2a-1 and 2a-2 partially contain the same material as that of the element isolation insulating films 5a, the tunnel insulating films 2a-1 and 2a-2 are undesirably etched by etching for adjusting the height of the element isolation insulating films 5a. That is, etching selectivity between the element isolation insulating films 5a and the tunnel insulating films 2a-1 and 2a-2 can not be obtained.

In the section in the channel width direction of selection transistors ST1 and ST2 as shown in FIG. 2B, element isolation insulating films 5b are formed in the semiconductor substrate 1, and the selection transistors ST1 and ST2 isolated by the element isolation insulating films 5b are formed.

In the selection transistors ST1 and ST2, a gate insulating film 10 is formed on the semiconductor substrate 1. The gate insulating film 10 has a stacked structure including oxide films 7b-1 and 7b-2 made of, e.g., silicon oxide films and a block insulating film 8b. More specifically, the oxide films 7b-1 and 7b-2 are formed on the semiconductor substrate 1, and the block insulating film 8b is formed on the oxide films 7b-1 and 7b-2. The block insulating film 8b is the same insulating film as the block insulating film 8a of the memory cell transistors MT1 and MT2. The oxide films 7b-1 and 7b-2 and block insulating film 8b are insulating films different from the charge storage layers 3a-1 and 3a-2 of the memory cell transistors MT1 and MT2. That is, the gate insulating film 10 of the selection transistors ST1 and ST2 does not include the same layer as the charge storage layers 3a-1 and 3a-2. A gate electrode 9b is formed on the block insulating film 8b.

The film thickness of the oxide films 7b-1 and 7b-2 is desirably larger than that of the tunnel insulating films 2a-1 and 2a-2 of the memory cell transistors MT1 and MT2. When the oxide films 7b-1 and 7b-2 are made thick, the electric charge trapped in the oxide films 7b-1 and 7b-2 can be prevented. The upper surfaces of the oxide films 7b-1 and 7b-2 can be higher than, lower than, or leveled with those of the element isolation insulating films 5b.

The block insulating film 8b is a film (e.g., an $Al_2O_3$ film) having a dielectric constant larger than that of the oxide films 7b-1 and 7b-2. This makes it possible to improve the characteristics of the selection transistors ST1 and ST2.

FIGS. 2A and 2B to FIGS. 8A and 8B illustrate, for individual fabrication steps, the sections in the channel width directions of the memory cell transistors and selection transistors of the nonvolatile semiconductor memory device according to the first embodiment of the present invention. A method of fabricating the nonvolatile semiconductor memory device according to the first embodiment will be explained below.

Figure 3A:
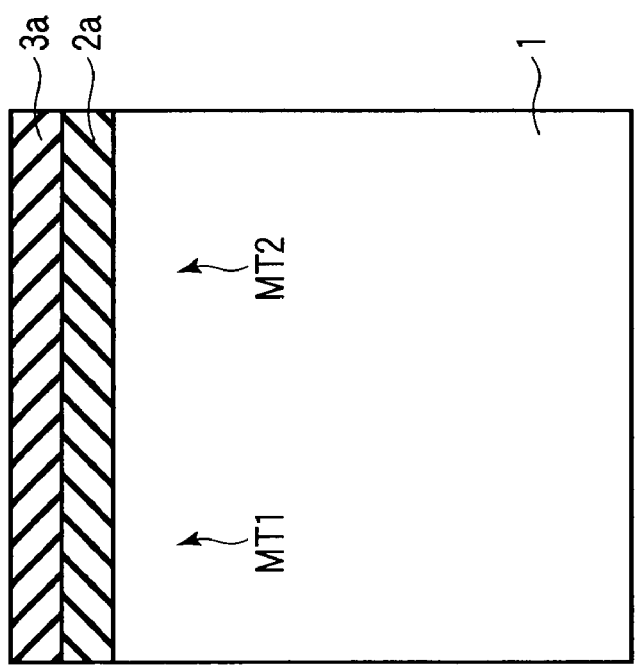

As shown in FIGS. 3A and 3B, well channel regions (not shown) of the memory cell transistors MT1 and MT2 and selection transistors ST1 and ST2 are formed in the semiconductor substrate 1 by ion implantation. Then, silicon oxide films 2a and 2b as the tunnel insulating films 2a-1 and 2a-2 of the memory cell transistors MT1 and MT2 are formed on the semiconductor substrate 1 by, e.g., thermal oxidation. Subsequently, silicon nitride films 3a and 3b as the charge storage layers 3a-1 and 3a-2 of the memory cell transistors MT1 and MT2 are formed on the silicon oxide films 2a and 2b by, e.g., CVD (Chemical Vapor Deposition).

Figure 4A:
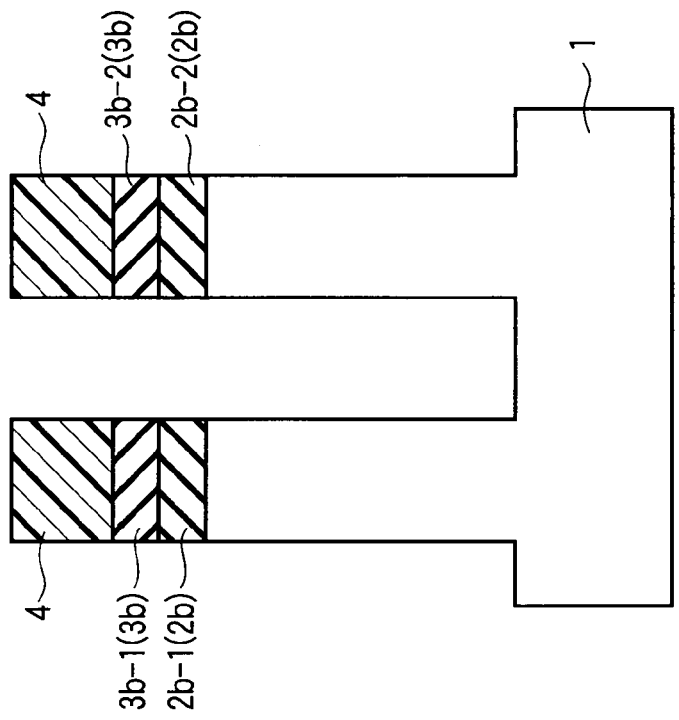
Figure 4B:
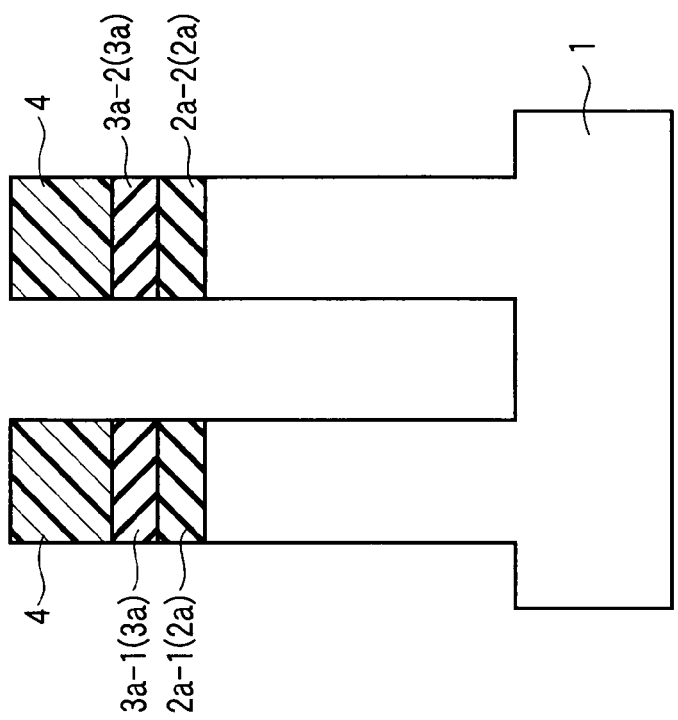

As shown in FIGS. 4A and 4B, a mask material 4 made of, e.g., a stacked film of a silicon oxide film and silicon nitride film is deposited on the silicon nitride films 3a and 3b. After that, holes are formed by lithography in those portions of the mask material 4 which correspond to element isolation regions. The silicon nitride films 3a and 3b, silicon oxide films 2a and 2b, and semiconductor substrate 1 are sequentially processed by etching by using the mask material 4, thereby forming trenches as element isolation regions in the semiconductor substrate 1. Consequently, silicon oxide films 2a-1, 2a-2, 2b-1, and 2b-2 and silicon nitride films 3a-1, 3a-2, 3b-1, and 3b-2 are formed as they are isolated for individual elements.

Figure 5B:
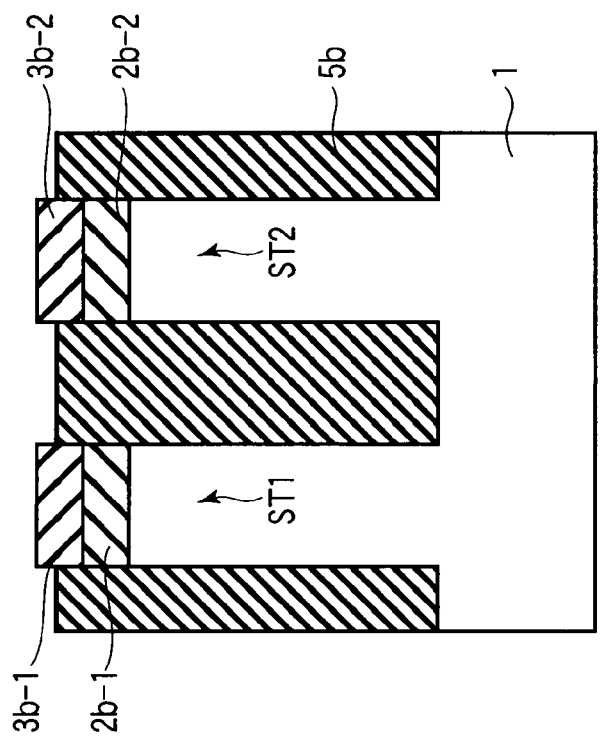
Figure 5A:
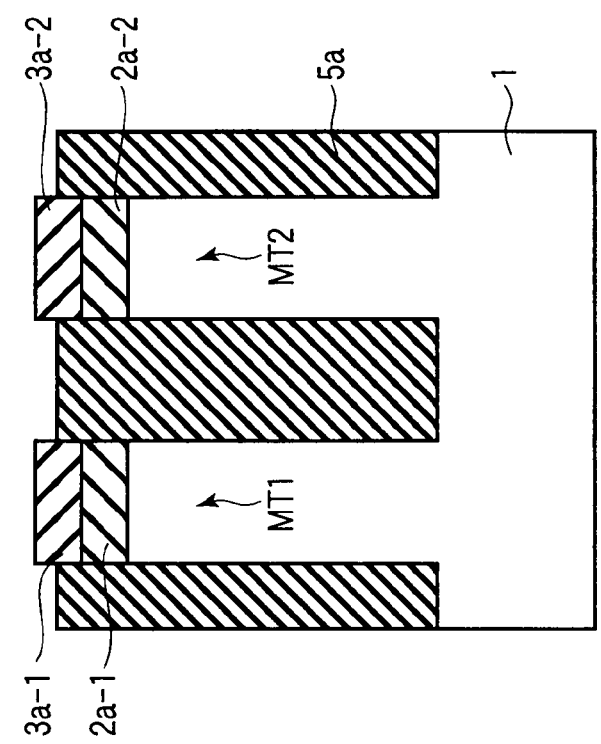

As shown in FIGS. 5A and 5B, element isolation insulating films 5a and 5b made of, e.g., silicon oxide films are formed in the trenches formed in the semiconductor substrate 1. After the element isolation insulating films 5a and 5b are planarized by CMP (Chemical Mechanical Polish), the height is adjusted by etching, and the mask material 4 is removed. For example, the upper surfaces of the element isolation insulating films 5a and 5b are lowered to about the middle of the film thickness of the charge storage layers 3a-1, 3a-2, 3b-1, and 3b-2.

Figure 6A:
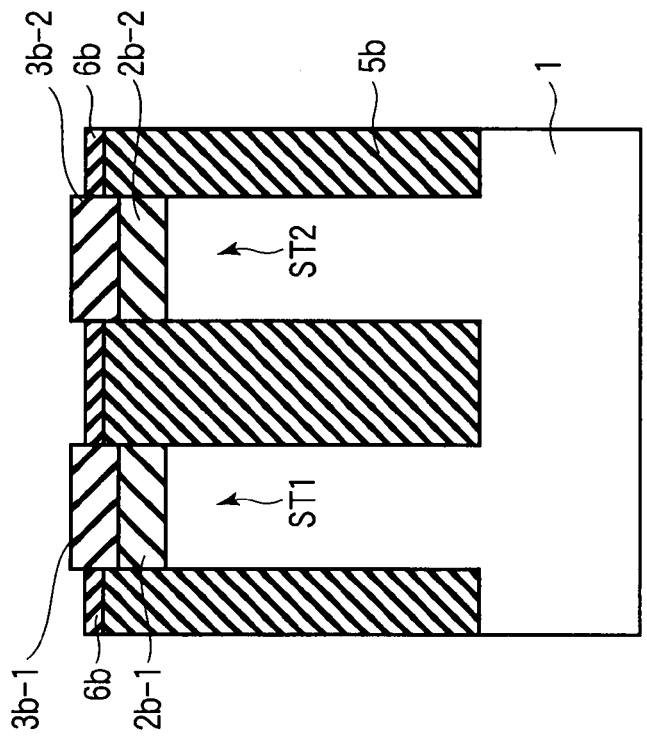
Figure 6B:
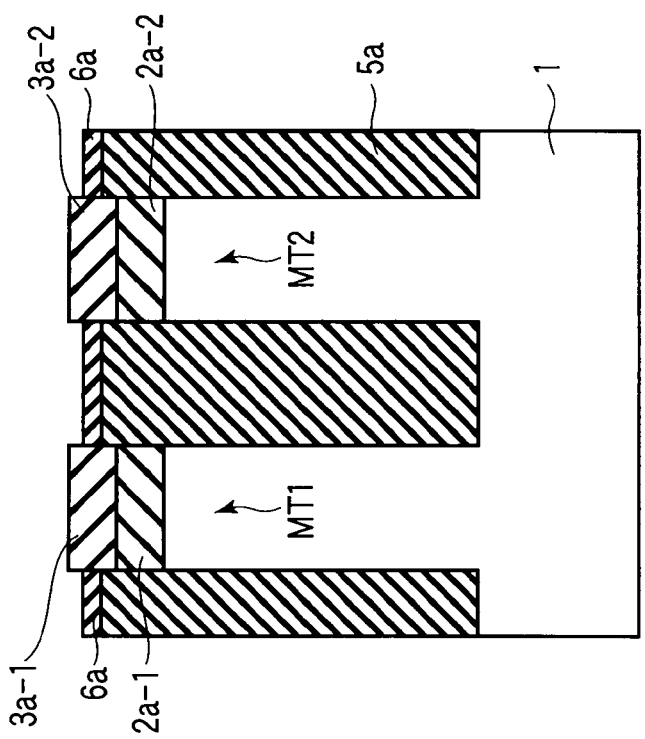

As shown in FIGS. 6A and 6B, barrier insulating films 6a and 6b made of silicon oxynitride films are formed on the element isolation insulating films 5a and 5b by, e.g., annealing performed in a nitride atmospherics. The film thickness of the barrier insulating films 6a is smaller than that of the charge storage layers 3a-1 and 3a-2, and the side surfaces of the barrier insulating film 6a are in contact with almost central portions of the side surfaces of the charge storage layers 3a-1 and 3a-2.

Up to this step, the memory cell transistors MT1 and MT2 and selection transistors ST1 and ST2 have the same structure.

Figure 7B:
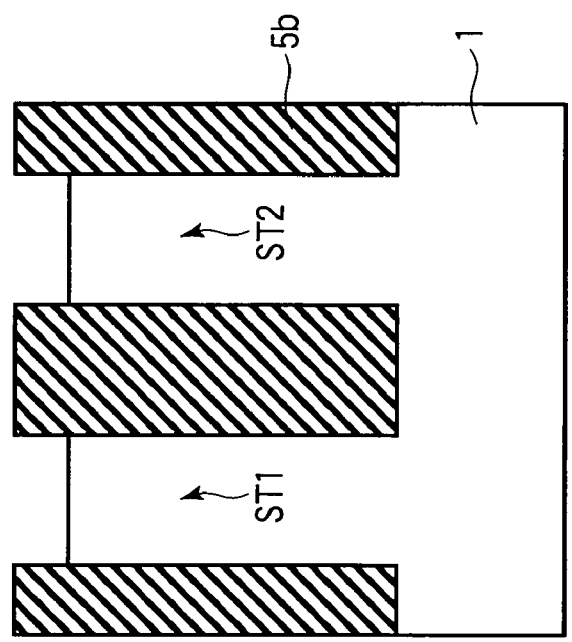
Figure 7A:
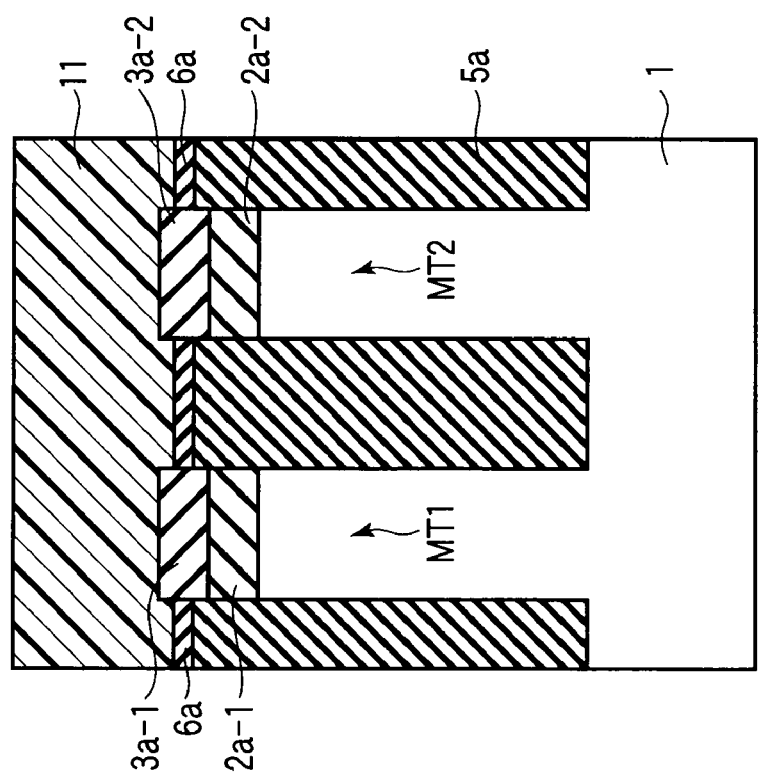

As shown in FIG. 7A, a mask material 11 is deposited on the memory cell transistors MT1 and MT2 and selection transistors ST1 and ST2. Subsequently, the mask material 11 which correspond to the selection transistors ST1 and ST2 are formed holes by lithography step. As shown in FIG. 7B, the silicon nitride films 3b-1 and 3b-2 and silicon oxide films 2b-1 and 2b-2 of the selection transistors ST1 and ST2 are removed by etching. In this step, the barrier insulating films 6b made of silicon oxynitride films are also removed. As a consequence, the semiconductor substrate 1 between the element isolation insulating films 5b is exposed in the selection transistors ST1 and ST2.

Figure 8A:
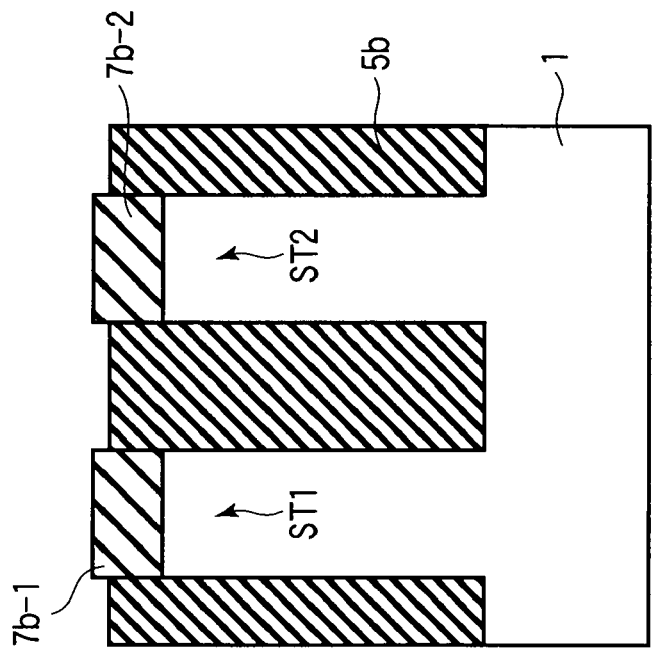
Figure 8B:
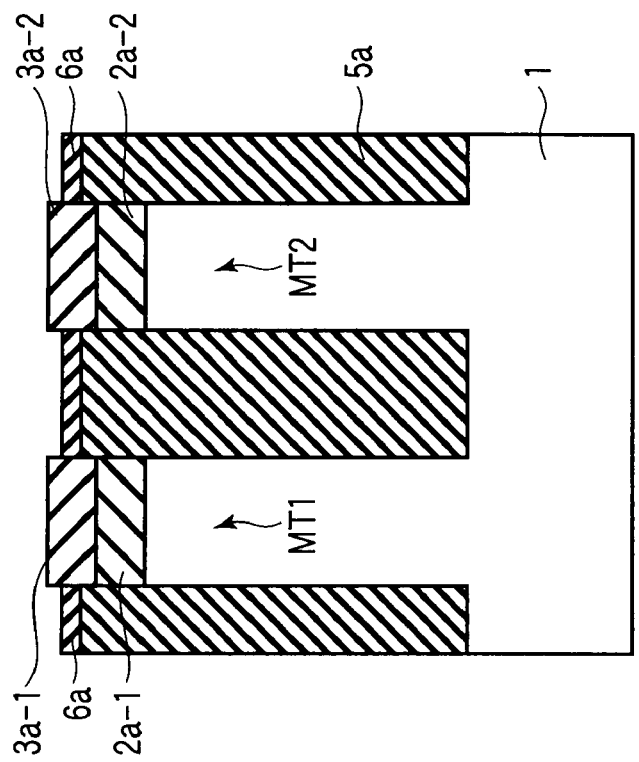

As shown in FIG. 8A, the mask material 11 is removed from the memory cell transistors MT1 and MT2. As shown in FIG. 8B, oxide films 7b-1 and 7b-2 made of silicon oxide films are formed on the semiconductor substrate 1 of the selection transistors ST1 and ST2 by, e.g., thermal oxidation. The oxide films 7b-1 and 7b-2 are desirably formed thicker than, e.g., the tunnel insulating films 2a-1 and 2a-2 of the memory cell transistors MT1 and MT2. Since the surfaces of the memory cell transistors MT1 and MT2 are covered with the charge storage layers 3a-1 and 3a-2 made of silicon nitride films and the barrier insulating films 6a made of silicon oxynitride films, the film thickness of the tunnel insulating films 2a-1 and 2a-2 made of silicon oxide films does not increase.

As shown in FIGS. 2A and 2B, block insulating films 8a and 8b made of, e.g., $Al_2O_3$ films are formed on the memory cell transistors MT1 and MT2 and selection transistors ST1 and ST2. Since the surfaces of the memory cell transistors MT1 and MT2 are covered with the charge storage layers 3a-1 and 3a-2 made of silicon nitride films and the barrier insulating films 6a made of silicon oxynitride films, impurity element dose not diffuse near the element regions of the memory cell transistors MT1 and MT2 when the $Al_2O_3$ films are formed. Subsequently, gate electrodes 9a and 9b made of, e.g., TaN/WN/W films are formed on the block insulating films 8a and 8b.

The gate electrodes 9a and 9b are processed by using a generally known method. The fabrication cost can be decreased by simultaneously forming and processing the block insulating films 8a and 8b and gate electrodes 9a and 9b of the memory cell transistors MT1 and MT2 and selection transistors ST1 and ST2. In addition, after diffusion layer regions are formed, contact electrodes (not shown) and upper interconnection layers (not shown) are formed. In this manner, the nonvolatile semiconductor memory device according to this embodiment is completed.

Note that the memory cell transistors MT1 and MT2 and selection transistors ST1 and ST2 described above are not limited to the above-mentioned materials, and can variously be changed.

In the first embodiment described above, the barrier insulating films 6a made of silicon oxynitride films are formed on the element isolation insulating films 5a made of silicon oxide films in the memory cell transistors MT1 and MT2. The side surfaces of the barrier insulating films 6a are in direct contact with the adjacent charge storage layers 3a-1 and 3a-2. Accordingly, the upper surface of the element isolation insulating films 5a is completely covered with the barrier insulating films 6a. The barrier insulating films 6a are formed before the block insulating film 8a is formed. The barrier insulating films 6a can prevent an impurity element diffused into the element isolation insulating films 5a when the block insulting film 8a is formed. That is, generating a fixed electric charge near the element regions can be prevented. Therefore, it is possible to suppress the fluctuation in threshold voltage of the memory cell transistors MT1 and MT2 caused by impurity diffusion, and improve deterioration of the characteristics of the memory cell transistors MT1 and MT2.

Also, in conventional nonvolatile semiconductor memory devices, a selection transistor has the same structure as that of a memory cell transistor. Therefore, a gate insulating film of the selection transistor includes a charge storage layer. When a read operation is performed many times in this structure, the voltage stress applied to the gate electrode of the selection transistor in data read injects electric charge in the charge storage layer of the selection transistor. Consequently, the threshold voltage of the selection transistor changes, and an operation error occurs.

In the first embodiment, therefore, the gate insulating film 10 of the selection transistors ST1 and ST2 has the structure in which the block insulating film 8b is stacked on the oxide films 7b-1 and 7b-2. In this structure, however, when forming the oxide films 7b-1 and 7b-2 of the gate insulating film 10 of the selection transistors ST1 and ST2 by thermal oxidation, an oxidizer may enter from the element isolation insulating films 5a of the memory cell transistors MT1 and MT2 and oxidize the tunnel insulating films 2a-1 and 2a-2 as well. This may increase the film thickness of the tunnel insulating films 2a-1 and 2a-2, and degrade the characteristics of the memory cell transistors MT1 and MT2.

In the first embodiment as described previously, however, the barrier insulating films 6a made of silicon oxynitride films are formed on the element isolation insulating films 5a made of silicon oxide films in the memory cell transistors MT1 and MT2. The barrier insulating films 6a are formed before the formation of the oxide films 7b-1 and 7b-2 of the gate insulating film 10 of the selection transistors ST1 and ST2. The barrier insulating films 6a make it possible to prevent the oxidizer diffused from the upper surface of the element isolation insulating films 5a to the element isolation insulating films 5a when the oxide films 7b-1 and 7b-2 are formed, and suppress degradation of the characteristics of the memory cell transistors MT1 and MT2.

Also, the barrier insulating films 6a are made of layers different from the charge storage layers 3a-1 and 3a-2. Accordingly, it is possible to suppress the movement of electric charge between the adjacent memory cell transistors MT1 and MT2, and improve deterioration of the data holding characteristic. Furthermore, by forming the charge storage layers 3a-1 and 3a-2 and barrier insulating films 6a by different methods, the charge trap site density of the barrier insulating films 6a can be made lower than that of the charge storage layers 3a-1 and 3a-2. This makes it possible to further suppress the movement of electric charge between the adjacent memory cell transistors MT1 and MT2, and further improve deterioration of the data holding characteristic.

Second Embodiment

In the first embodiment, the barrier insulating film is formed on only an element isolation insulating film in the memory cell transistor. By contrast, the second embodiment is an example in which a barrier insulating film extending from a portion on an element isolation insulating film to a portion on a charge storage layer is formed in a memory cell transistor. Note that an explanation of the same features as those of the first embodiment will not be repeated, and differences will be explained in detail below.

FIG. 9A is a sectional view in the channel width direction of memory cell transistors of a nonvolatile semiconductor memory device according to the second embodiment of the present invention. FIG. 9B is a sectional view in the channel width direction of selection transistors of the nonvolatile semiconductor memory device according to the second embodiment of the present invention. The structures of the memory cell transistor and selection transistor of the nonvolatile semiconductor memory device according to the second embodiment will be explained below.

As shown in FIGS. 9A and 9B, the second embodiment differs from the first embodiment in that a barrier insulating film 6a extending from portions on element isolation insulating films 5a to portions on charge storage layers 3a-1 and 3a-2 are formed in memory cell transistors MT1 and MT2.

More specifically, as shown in FIG. 9A, the bottom surface of the barrier insulating film 6a is in direct contact with the upper surfaces of the element isolation insulating films 5a and the side surfaces and upper surfaces of the charge storage layers 3a-1 and 3a-2. That is, all the surfaces of the element isolation insulating films 5a and charge storage layers 3a-1 and 3a-2 are covered with the barrier insulating film 6a. Accordingly, the upper surfaces of the element isolation insulating films 5a and charge storage layers 3a-1 and 3a-2 are not in direct contact with a block insulating film 8a.

In the second embodiment, an example of the material of the barrier insulating film 6a is a silicon nitride film. The barrier insulating film 6a is desirably formed by CVD.

Note that as shown in FIG. 9B, the section in the channel width direction of selection transistors ST1 and ST2 has the same structure as that of the first embodiment.

FIGS. 9A and 9B to FIGS. 12A and 12B illustrate, for individual fabrication steps, the sections in the channel width directions of the memory cell transistors and selection transistors of the nonvolatile semiconductor memory device according to the second embodiment of the present invention. A method of fabricating the nonvolatile semiconductor memory device according to the second embodiment will be explained below.

The steps shown in FIGS. 3A and 3B to FIGS. 5A and 5B are performed in the same manner as in the fabrication process of the first embodiment, in the second embodiment as well.

Figure 10A:
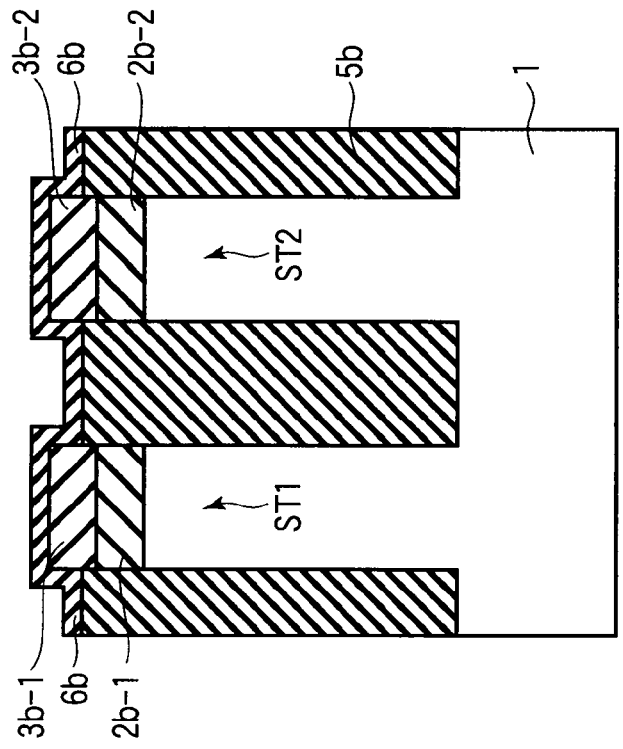
Figure 10B:
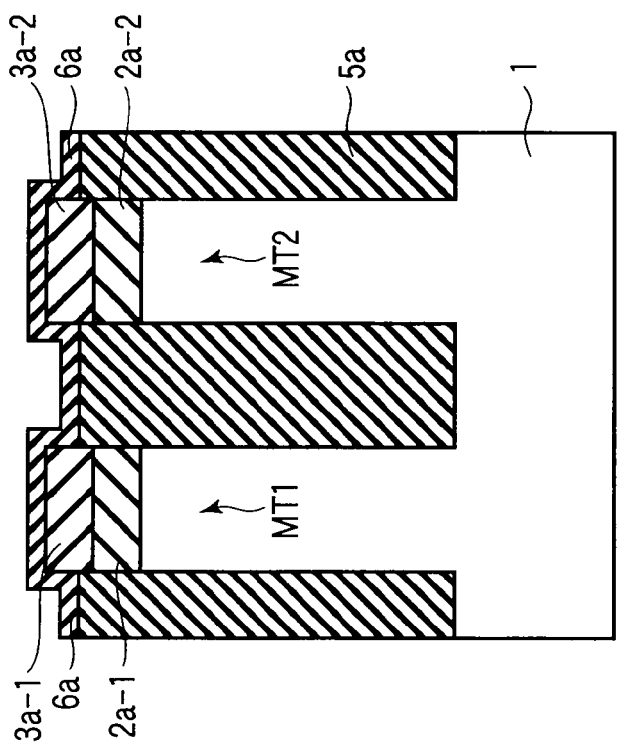

As shown in FIGS. 10A and 10B, barrier insulating films 6a and 6b made of silicon nitride films are formed on element isolation insulating films 5a and 5b and charge storage layers 3a-1, 3a-2, 3b-1, and 3b-2. Consequently, all the surfaces of the element isolation insulating films 5a and charge storage layers 3a-1 and 3a-2 are covered with the barrier insulating film 6a in the memory cell transistors MT1 and MT2, and all the surfaces of the element isolation insulating films 5b and charge storage layers 3b-1 and 3b-2 are covered with the barrier insulating film 6b in the selection transistors ST1 and ST2.

Figure 11B:
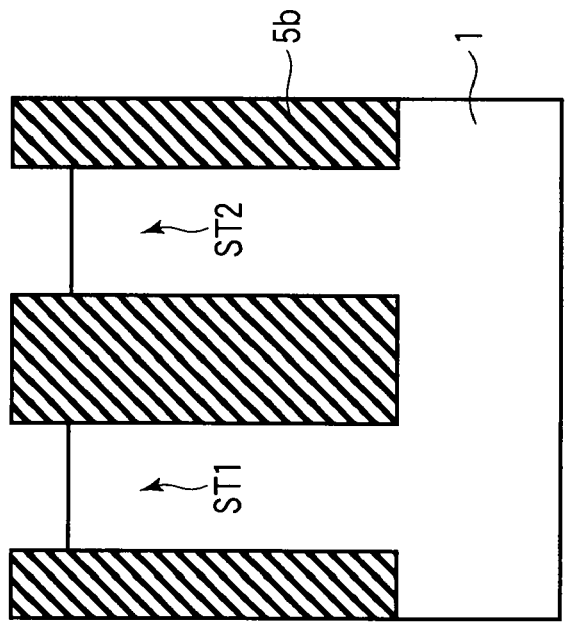
Figure 11A:
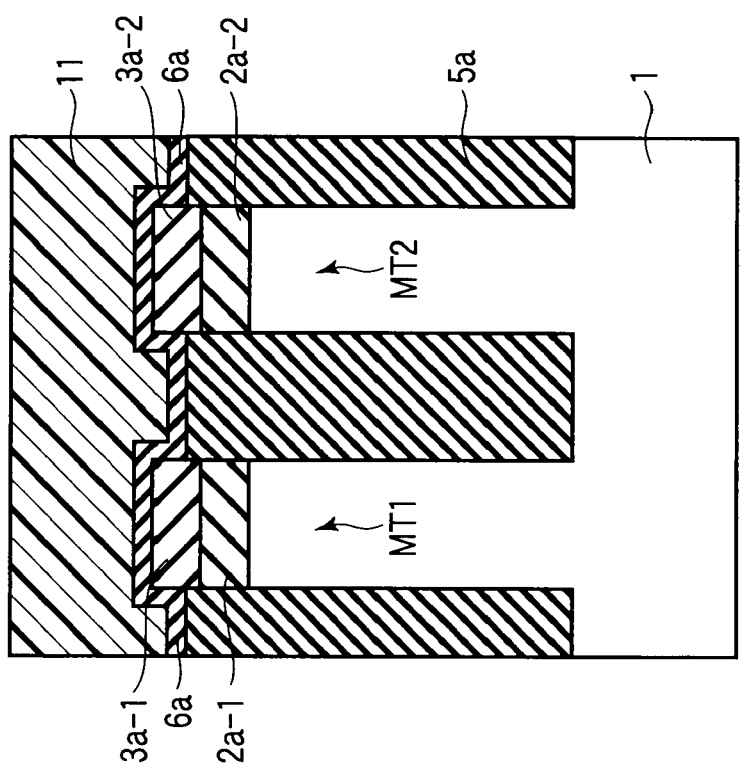

As shown in FIGS. 11A and 11B, a mask material 11 is formed on the memory cell transistors MT1 and MT2 in the same manner as in the fabrication step shown in FIGS. 7A and 7B of the first embodiment. The barrier insulating film 6b, the silicon nitride films 3b-1 and 3b-2, and silicon oxide films 2b-1 and 2b-2 of the selection transistors ST1 and ST2 are removed by using the mask material 11. After that, the mask material 11 is removed.

Figure 12A:
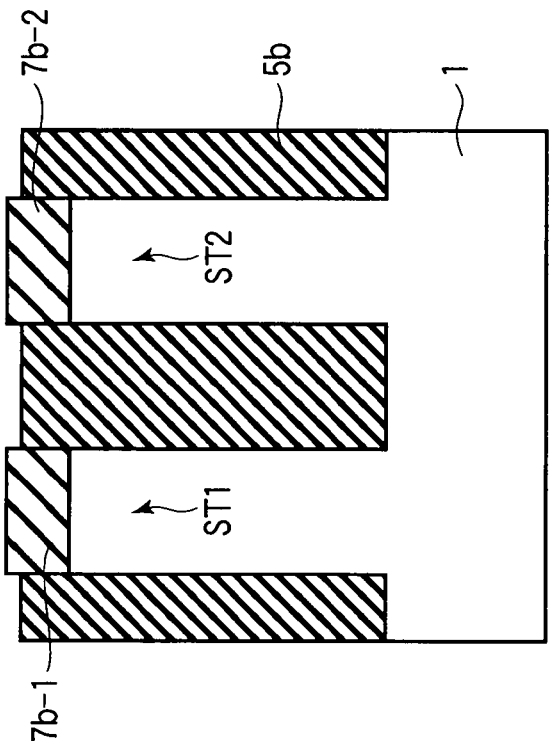
Figure 12B:
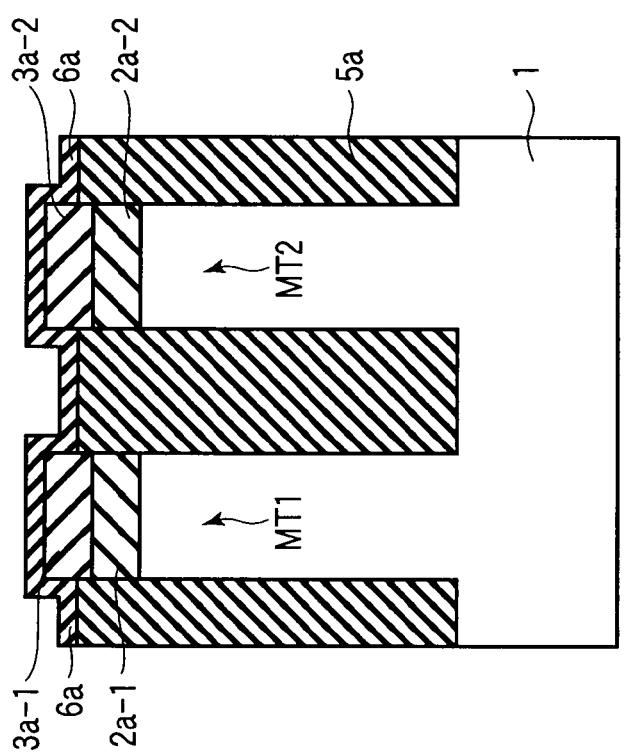

As shown in FIGS. 12A and 12B, oxide films 7b-1 and 7b-2 made of, e.g., silicon oxide films are formed on a semiconductor substrate 1 of the selection transistors ST1 and ST2 by, e.g., thermal oxidation, in the same manner as in the fabrication step shown in FIGS. 8A and 8B of the first embodiment.

As shown in FIGS. 9A and 9B, block insulating films 8a and 8b made of, e.g., Al$_2$O$_3$ films are formed on the memory cell transistors MT1 and MT2 and selection transistors ST1 and ST2, gate electrodes 9a and 9b made of, e.g., TaN/WN/W films are formed on the block insulating films 8a and 8b, in the same manner as in the fabrication step shown in FIGS. 2A and 2B of the first embodiment.

Note that the memory cell transistors MT1 and MT2 and selection transistors ST1 and ST2 described above are not limited to the above-mentioned materials, and can variously be changed.

The second embodiment can achieve the same effects as those of the first embodiment.

In addition, in the second embodiment, the barrier insulating film 6a is formed to extend from the portions on the element isolation insulating films 5a to the portions on the charge storage layers 3a-1 and 3a-2 in the memory cell transistors MT1 and MT2. Therefore, all the surfaces of the element isolation insulating films 5a and charge storage layers 3a-1 and 3a-2 are covered with the barrier insulating film 6a. Accordingly, when compared to the first embodiment, this embodiment can further improve the barrier characteristic that prevents an impurity element and oxidizer from entering the element isolation insulating films 5a, and further improve deterioration of the characteristics of the memory cell transistors MT1 and MT2.

Note that the first embodiment differs from the second embodiment in that no barrier insulating film 6a is formed between the block insulating film 8a and charge storage layers 3a-1 and 3a-2. That is, in the memory cell transistors of the first embodiment, the distance from the lower surface of the block layer 8a to the upper surfaces of the tunnel insulating films 2a-1 and 2a-2 can be adjusted by only the charge storage layers 3a-1 and 3a-2. When compared to the second embodiment, therefore, the first embodiment reduces the variation of electric field to be applied to tunnel insulating films 2a-1 and 2a-2 when programming data in the memory cells.

Third Embodiment

In the first embodiment, the barrier insulating film is formed on only the element isolation insulating film of the memory cell transistor. By contrast, the third embodiment is an example in which a barrier insulating film is formed not only on an element isolation insulating film of a memory cell transistor, but also on an element isolation insulating film of a selection transistor. Note that an explanation of the same features as those of the first embodiment will not be repeated, and differences will be explained in detail below.

FIG. 13A is a sectional view in the channel width direction of memory cell transistors of a nonvolatile semiconductor memory device according to the third embodiment of the present invention. FIG. 13B is a sectional view in the channel width direction of selection transistors of the nonvolatile semiconductor memory device according to the third embodiment of the present invention. The structures of the memory cell transistor and selection transistor of the nonvolatile semiconductor memory device according to the third embodiment will be explained below.

As shown in FIGS. 13A and 13B, the third embodiment differs from the first embodiment in that barrier insulating films 6b are formed on element isolation insulating films 5b in selection transistors ST1 and ST2.

More specifically, as shown in FIG. 13B, the barrier insulating films 6b are formed between the element isolation insulating films 5b and a block insulating film 8b. The side surfaces of the barrier insulating films 6b are in contact with adjacent oxide films 7b-1 and 7b-2. Accordingly, the element isolation insulating films 5b are completely covered with the barrier insulating films 6b. Hence, the upper surfaces of the element isolation insulating films 5b are not in direct contact with the block insulating film 8b.

The barrier insulating films 6b are formed simultaneously with, e.g., barrier insulating films 6a. In this case, the film thickness, material, and properties of the barrier insulating films 6b are the same as those of the barrier insulating films 6a as described in the first embodiment.

Note that as shown in FIG. 13A, the section in the channel width direction of memory cell transistors MT1 and MT2 has the same structure as that of the first embodiment.

FIGS. 13A and 13B to FIGS. 16A and 16B illustrate, for individual fabrication steps, the sections in the channel width directions of the memory cell transistors and selection transistors of the nonvolatile semiconductor memory device according to the third embodiment of the present invention. A method of fabricating the nonvolatile semiconductor memory device according to the third embodiment will be explained below.

The third embodiment differs from the first embodiment in that the step of forming the barrier insulating films 6a and 6b on the element isolation insulating films 5a and 5b in a nitride atmospherics as shown in FIGS. 6A and 6B is performed immediately after the oxide films 7b-1 and 7b-2 are formed on a semiconductor substrate in the element regions of the selection transistors ST1 and ST2.

The steps shown in FIGS. 3A and 3B to FIGS. 5A and 5B are performed in the same manner as in the fabrication process of the first embodiment, in the third embodiment as well.

Figure 14B:
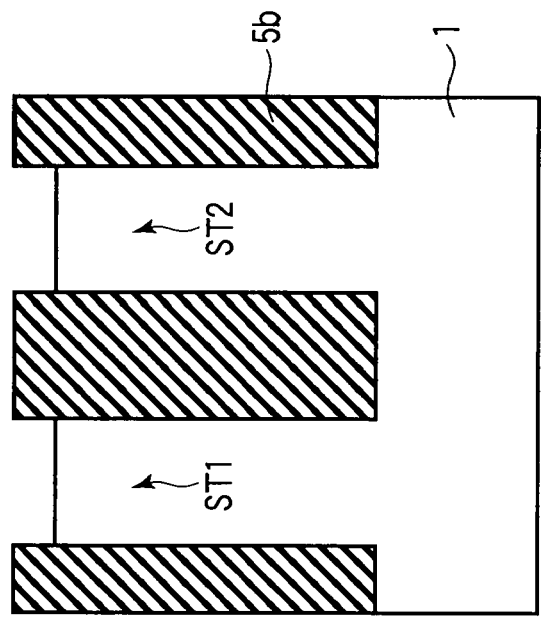
Figure 14A:
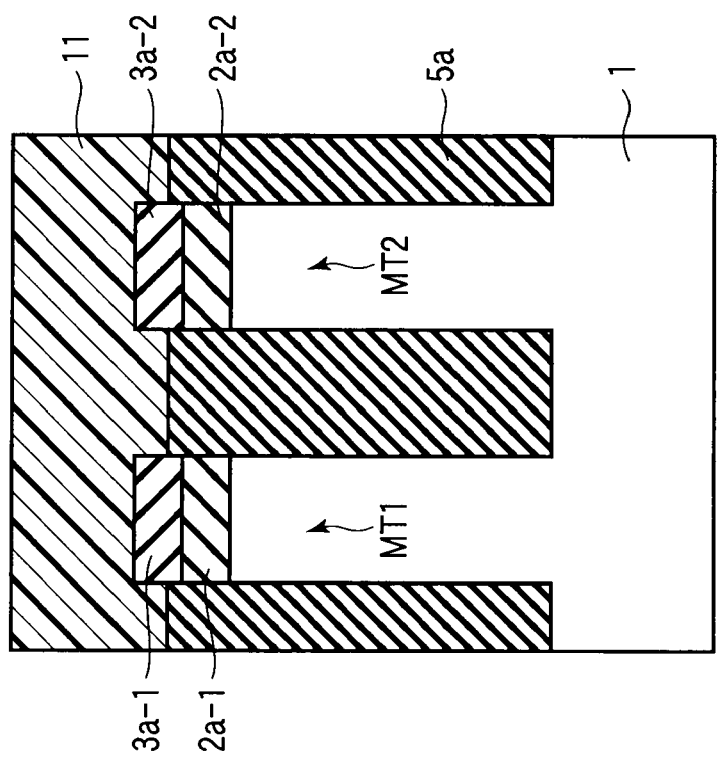

As shown in FIGS. 14A and 14B, a mask material 11 is formed on the regions of the memory cell transistors MT1 and MT2, and silicon nitride films 3b-1 and 3b-2 and silicon oxide films 2b-1 and 2b-2 are removed by using the mask material 11.

As shown in FIG. 15A, the mask material 11 is removed from the memory cell transistors MT1 and MT2. As shown in FIG. 15B, oxide films 7b-1 and 7b-2 made of silicon oxide films are formed on a semiconductor substrate 1 of the selection transistors ST1 and ST2 by, e.g., thermal oxidation.

Figure 16A:
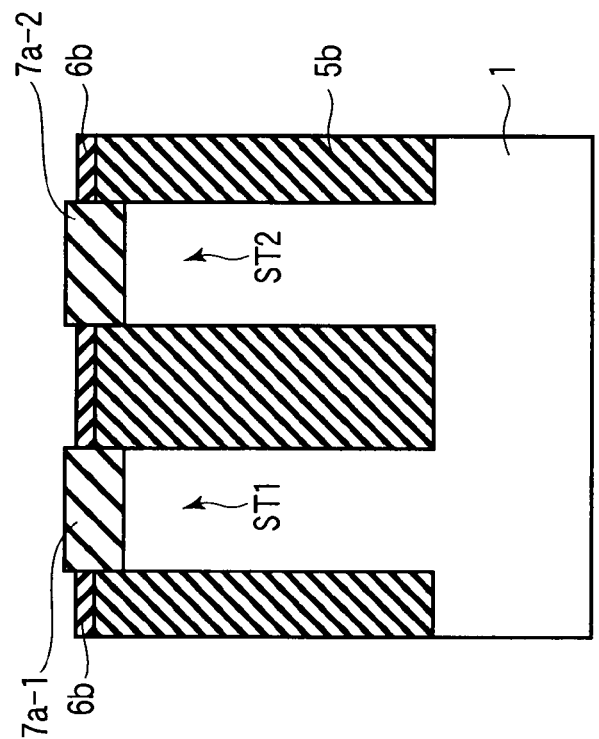
Figure 16B:
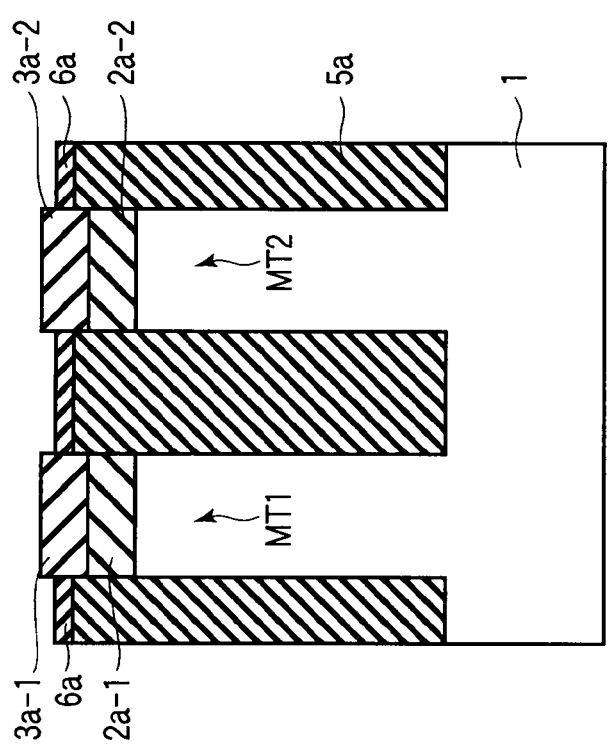

As shown in FIGS. 16A and 16B, barrier insulating films 6a and 6b made of silicon oxynitride films are formed on element isolation insulating films 5a and 5b by, e.g., annealing performed in a nitride atmospherics.

As shown in FIGS. 13A and 13B, block insulating films 8a and 8b made of, e.g., Al$_2$O$_3$ films are formed on the memory cell transistors MT1 and MT2 and selection transistors ST1 and ST2, and gate electrodes 9a and 9b made of, e.g., TaN/WN/W films are formed on the block insulating films 8a and 8b, in the same manner as in the fabrication step shown in FIGS. 1A and 1B of the first embodiment.

Note that the memory cell transistors MT1 and MT2 and selection transistors ST1 and ST2 described above are not limited to the above-mentioned materials, and can variously be changed.

In the third embodiment described above, the barrier insulating films 6a are formed on the element isolation insulating films 5a before the block insulating film 8a is formed in the memory cell transistors MT1 and MT2, as in the first embodiment. This makes it possible to reduce the variation in threshold voltage of the memory cell transistors MT1 and MT2 caused by impurity diffusion, and improve degradation of the characteristics of the memory cell transistors MT1 and MT2.

Also, in the selection transistors ST1 and ST2 of the third embodiment, the barrier insulating films 6b made of silicon oxynitride films are formed on the element isolation insulating films 5b made of silicon oxide films. The side surfaces of the barrier insulating films 6b are in contact with the oxide films 7b-1 and 7b-2. Therefore, the element isolation insulating films 5b are completely covered with the barrier insulating films 6b. The barrier insulating films 6b are formed before the formation of the block insulating film 8b. This makes it possible to prevent an impurity element diffused into element isolation insulating films 5b when the block insulating film 8b is formed. Accordingly, deterioration of the characteristics of the selection transistors ST1 and ST2 caused by impurity diffusion can be suppressed.

Note that in each of the above embodiments, the tunnel insulating films 2a-1 and 2a-2 are not limited to single-layered films, and may also be stacked films including, e.g., a silicon oxide film/silicon nitride film or silicon oxynitride film/silicon oxide film. Also, the gate electrodes 9a and 9b may also have a structure in which polysilicon and silicide such as CoSi or NiSi are stacked on TaN.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   a semiconductor substrate;
   a first element isolation insulating film formed in the semiconductor substrate;
   a first memory cell transistor and a second memory cell transistor isolated by the first element isolation insulating film; and
   a first barrier insulating film covering the first element isolation insulating film,
   the first memory cell transistor including
   a first tunnel insulating film formed on the semiconductor substrate,
   a first charge storage layer formed on the first tunnel insulating film and made of an insulating film,
   a first block insulating film formed on the first charge storage layer, and
   a first gate electrode formed on the first block insulating film,
   the second memory cell transistor including
   a second tunnel insulating film formed on the semiconductor substrate,
   a second charge storage layer formed on the second tunnel insulating film and made of an insulating film,
   a second block insulating film formed on the second charge storage layer, and
   a second gate electrode formed on the second block insulating film, and
   the first barrier insulating film being in contact with the first charge storage layer and the second charge storage layer, and having a film thickness smaller than that of the first charge storage layer and the second charge storage layer.

2. The device according to claim 1, wherein the first barrier insulating film extends from a portion on the first element isolation insulating film to portions on the first charge storage layer and the second charge storage layer.

3. The device according to claim 1, further comprising:
   a second element isolation insulating film formed in the semiconductor substrate; and
   a first selection transistor and a second selection transistor isolated by the second element isolation insulating film,
   the first selection transistor including
   a first gate insulating film including a first oxide film formed on the semiconductor substrate and a third block insulating film formed on the first oxide film, the first oxide film and the third block insulating film being insulating films different from the first charge storage layer and the second charge storage layer, and
   a third gate electrode formed on the first gate insulating film, and
   the second selection transistor including
   a second gate insulating film including a second oxide film formed on the semiconductor substrate and a fourth block insulating film formed on the second oxide film, the second oxide film and the fourth block insulating film being insulating films different from the first charge storage layer and the second charge storage layer, and a fourth gate electrode formed on the second gate insulating film.

4. The device according to claim 3, further comprising a second barrier insulating film covering the second element isolation insulating film, and formed in contact with the first oxide film and the second oxide film.

5. The device according to claim 1, wherein a dielectric constant of the first block insulating film and the second block insulating film is larger than that of the first tunnel insulating film and the second tunnel insulating film.

6. The device according to claim 4, wherein the first barrier insulating film and the second barrier insulating film each comprise one of a silicon nitride film and a silicon oxynitride film.

7. The device according to claim 4, wherein the first barrier insulating film and the second barrier insulating film each comprise a film which changes from a silicon nitride film to a silicon oxynitride film from an upper surface toward a bottom surface.

8. The device according to claim 1, wherein an upper surface of the first element isolation insulating film and an upper surface of the first barrier insulating film are lower than upper surfaces of the first charge storage layer and the second charge storage layer.

9. The device according to claim 3, wherein a film thickness of the first oxide film and the second oxide film is larger than that of the first tunnel insulating film and the second tunnel insulating film.

10. The device according to claim 3, wherein a dielectric constant of the third block insulating film and the fourth block insulating film is larger than that of the first oxide film and the second oxide film.

11. A nonvolatile semiconductor memory device comprising:
a semiconductor substrate;
a first element isolation insulating film formed in the semiconductor substrate;
a first memory cell transistor and a second memory cell transistor isolated by the first element isolation insulating film; and
a first barrier insulating film covering the first element isolation insulating film,
the first memory cell transistor including
a first tunnel insulating film formed on the semiconductor substrate,
a first charge storage layer formed on the first tunnel insulating film and made of an insulating film,
a first block insulating film formed on the first charge storage layer, and
a first gate electrode formed on the first block insulating film,
the second memory cell transistor including
a second tunnel insulating film formed on the semiconductor substrate,
a second charge storage layer formed on the second tunnel insulating film and made of an insulating film,
a second block insulating film formed on the second charge storage layer, and
a second gate electrode formed on the second block insulating film, and
the first barrier insulating film being in contact with the first charge storage layer and the second charge storage layer, and made of an insulating film different from the first charge storage layer and the second charge storage layer.

12. The device according to claim 11, wherein the first barrier insulating film extends from a portion on the first element isolation insulating film to portions on the first charge storage layer and the second charge storage layer.

13. The device according to claim 11, further comprising:
a second element isolation insulating film formed in the semiconductor substrate; and
a first selection transistor and a second selection transistor isolated by the second element isolation insulating film,
the first selection transistor including
a first gate insulating film including a first oxide film formed on the semiconductor substrate and a third block insulating film formed on the first oxide film, the first oxide film and the third block insulating film being insulating films different from the first charge storage layer and the second charge storage layer, and
a third gate electrode formed on the first gate insulating film, and
the second selection transistor including
a second gate insulating film including a second oxide film formed on the semiconductor substrate and a fourth block insulating film formed on the second oxide film, the second oxide film and the fourth block insulating film being insulating films different from the first charge storage layer and the second charge storage layer, and
a fourth gate electrode formed on the second gate insulating film.

14. The device according to claim 13, further comprising a second barrier insulating film covering the second element isolation insulating film, and formed in contact with the first oxide film and the second oxide film.

15. The device according to claim 11, wherein a dielectric constant of the first block insulating film and the second block insulating film is larger than that of the first tunnel insulating film and the second tunnel insulating film.

16. The device according to claim 14, wherein the first barrier insulating film and the second barrier insulating film each comprise one of a silicon nitride film and a silicon oxynitride film.

17. The device according to claim 14, wherein the first barrier insulating film and the second barrier insulating film each comprise a film which changes from a silicon nitride film to a silicon oxynitride film from an upper surface toward a bottom surface.

18. The device according to claim 11, wherein an upper surface of the first element isolation insulating film and an upper surface of the first barrier insulating film are lower than upper surfaces of the first charge storage layer and the second charge storage layer.

19. The device according to claim 13, wherein a film thickness of the first oxide film and the second oxide film is larger than that of the first tunnel insulating film and the second tunnel insulating film.

20. The device according to claim 13, wherein a dielectric constant of the third block insulating film and the fourth block insulating film is larger than that of the first oxide film and the second oxide film.

* * * * *